(12) United States Patent
Ely et al.

(10) Patent No.: US 10,264,690 B2
(45) Date of Patent: Apr. 16, 2019

(54) CERAMIC SINTERING FOR UNIFORM COLOR FOR A HOUSING OF AN ELECTRONIC DEVICE

(71) Applicant: Apple Inc., Cupertino, CA (US)

(72) Inventors: Colin M. Ely, Sunnyvale, CA (US);
Dale N. Memering, Langhorne, PA (US); Kazuya Takagi, Tokyo-to (JP);
Naoto Matsuyuki, Tokyo-to (JP);
Theodore A. Waniuk, Lake Forest, CA (US)

(73) Assignee: APPLE INC., Cupertino, CA (US)

( * ) Notice: Subject to any disclaimer, the term of this patent is extended or adjusted under 35 U.S.C. 154(b) by 71 days.

(21) Appl. No.: 15/611,329

(22) Filed: Jun. 1, 2017

(65) Prior Publication Data

US 2018/0063975 A1    Mar. 1, 2018

Related U.S. Application Data

(60) Provisional application No. 62/382,687, filed on Sep. 1, 2016.

(51) Int. Cl.
*H05K 5/02* (2006.01)
*C04B 35/48* (2006.01)
(Continued)

(52) U.S. Cl.
CPC .......... *H05K 5/0217* (2013.01); *C04B 35/48* (2013.01); *C04B 35/486* (2013.01); *C04B 35/64* (2013.01); *C09C 1/0009* (2013.01); *C04B 2235/3244* (2013.01); *C04B 2235/3262* (2013.01); *C04B 2235/3275* (2013.01); *C04B 2235/6567* (2013.01); *C04B 2235/661* (2013.01); *C04B 2235/9661* (2013.01)

(58) Field of Classification Search
CPC .... H05K 5/0217; C09C 1/0009; C04B 35/48; C04B 35/64; C04B 35/486; C04B 2235/3244; C04B 2235/6567; C04B 2235/9661; C04B 2235/3262; C04B 2235/3275; C04B 2235/661
See application file for complete search history.

(56) References Cited

U.S. PATENT DOCUMENTS

| 4,764,491 A | 8/1988 | Quadir |
| 4,833,001 A | 5/1989 | Kijima et al. |

(Continued)

FOREIGN PATENT DOCUMENTS

| CN | 105622096 | 6/2016 |
| EP | 0826645 | 3/1998 |

(Continued)

OTHER PUBLICATIONS

International Search Report and Written Opinion dated Nov. 20, 2017, PCT/US2017/048235, 13 pages.

(Continued)

*Primary Examiner* — Michael C Miggins
(74) *Attorney, Agent, or Firm* — Dorsey & Whitney LLP

(57) ABSTRACT

A method of manufacturing a housing of an electronic device includes determining a sintering profile configured to produce a selected color at a selected depth within a wall of the housing, sintering a ceramic housing precursor in accordance with the determined sintering profile, thereby forming the housing, and removing material from the housing up to the selected depth.

19 Claims, 9 Drawing Sheets

(51) Int. Cl.
*C04B 35/64* (2006.01)
*C09C 1/00* (2006.01)
*C04B 35/486* (2006.01)

(56) References Cited

U.S. PATENT DOCUMENTS

| | | |
|---|---|---|
| 4,857,093 A | 8/1989 | Prewo et al. |
| 6,133,181 A | 10/2000 | Wentworth et al. |
| 8,076,011 B2 | 12/2011 | Chiang et al. |
| 8,251,210 B2 | 8/2012 | Schmidt et al. |
| 8,298,975 B2 | 10/2012 | Hasegawa et al. |
| 8,322,560 B2 | 12/2012 | Jiang et al. |
| 8,394,167 B2 | 3/2013 | Merkel et al. |
| 8,442,604 B1 | 5/2013 | Diebel |
| 8,563,644 B2 | 10/2013 | Imada et al. |
| 8,781,109 B2 | 7/2014 | Hong |
| 9,007,747 B2 | 4/2015 | Gandhi |
| 9,011,997 B2 | 4/2015 | Weber |
| 9,448,713 B2 | 9/2016 | Cruz-Hernandez et al. |
| 9,516,150 B2 | 12/2016 | Jeon et al. |
| 2009/0197048 A1 | 8/2009 | Amin et al. |
| 2010/0003479 A1 | 1/2010 | Hwang et al. |
| 2012/0268412 A1 | 10/2012 | Cruz-Hernandez et al. |
| 2013/0108813 A1 | 5/2013 | Zhu |
| 2013/0224454 A1 | 8/2013 | Jung et al. |
| 2013/0316116 A1 | 11/2013 | Adams et al. |
| 2014/0178642 A1 | 6/2014 | Milanovska et al. |
| 2015/0010721 A1 | 1/2015 | Tanida et al. |
| 2015/0246459 A1 | 9/2015 | Dorn et al. |
| 2016/0089811 A1 | 3/2016 | Matsuyuki et al. |
| 2016/0090326 A1 | 3/2016 | Matsuyuki et al. |
| 2016/0255929 A1 | 9/2016 | Nazzaro et al. |
| 2016/0347674 A1 | 12/2016 | Meschke et al. |
| 2017/0075039 A1 | 3/2017 | Hart et al. |
| 2017/0088473 A1 | 3/2017 | Wilson et al. |
| 2017/0300114 A1 | 10/2017 | Matsuyuki et al. |
| 2017/0361067 A1 | 12/2017 | Nazzaro et al. |

FOREIGN PATENT DOCUMENTS

| | | |
|---|---|---|
| EP | 1857428 | 11/2007 |
| EP | 2243756 | 10/2010 |
| EP | 2266934 | 12/2010 |
| WO | WO 16/043378 | 3/2016 |

OTHER PUBLICATIONS

Siqueira et al., "Poly(borosiloxanes) as Precursors for Carbon Fiber Ceramic Matrix Composites," http://www.scielo.br/scielo.php?script=sci_arttext&pid=S1516-14392007000200009, Materials Research, vol. 10, No. 2, São Carlos, Apr./Jun. 2007.

U.S. Appl. No. 15/614,747, filed Jun. 6, 2017, Matsuyuki et al.

CERAMIC SINTERING FOR UNIFORM COLOR FOR A HOUSING OF AN ELECTRONIC DEVICE

CROSS-REFERENCE TO RELATED APPLICATION

This application claims the benefit under 35 U.S.C. § 119(e) of U.S. Provisional Patent Application No. 62/382,687, filed on Sep. 1, 2016, and entitled "Ceramic Sintering for Uniform Color for a Housing of an Electronic Device," the contents of which are incorporated by reference as if fully disclosed herein.

FIELD

The subject matter of this disclosure relates generally to ceramic electronic device housings, and more particularly to sintering ceramic housings to achieve selected colors at selected depths of the ceramic material.

BACKGROUND

Inks, dyes, or other materials or finishing techniques may be used to produce electronic device housings of various colors. For example, metal housings may be anodized to produce a housing having a particular color. As another example, ceramic housings may be produced from a ceramic powder or other precursor with pigments mixed therein. The technique used for coloring an electronic device housing should be compatible with the manufacturing and/or finishing processes to produce a housing having the desired shape, color, and surface finish.

SUMMARY

A method of manufacturing a housing of an electronic device includes determining a sintering profile configured to produce a selected color at a selected depth within a wall of the housing, sintering a ceramic housing precursor in accordance with the determined sintering profile, thereby forming the housing, and removing material from the housing up to the selected depth.

The operation of determining the sintering profile may include selecting the sintering profile from a set of sintering profiles, wherein each sintering profile produces a different color at a different depth.

The operation of determining the sintering profile may include selecting the color, sintering multiple ceramic housing precursors according to respective sample sintering profiles, thereby forming multiple sample housings, and selecting, as the sintering profile, the sample sintering profile that produces a sample housing having a color within a range of the selected color at the selected depth.

The operation of determining the sintering profile may include selecting a sintering temperature, and determining a sintering duration that produces a color within a range of the selected color at the selected depth.

The operation of determining the sintering profile may include selecting a sintering duration, and determining a sintering temperature that produces a color within a range of the selected color at the selected depth.

The method may further include forming the ceramic housing precursor by mixing a ceramic powder with a pigment, and forming the ceramic powder and the pigment into the ceramic housing precursor. The ceramic powder may include zirconia powder.

The method may further include forming the ceramic housing precursor by forming a ceramic powder into a green body component, and applying a pigment to a surface of the green body component, thereby forming the ceramic housing precursor.

The method may further include selecting the color, selecting a pigment to be added to a ceramic material, sintering, according to respective sample sintering profiles, multiple ceramic housing precursors resulting in the pigment mixed with the ceramic material, thereby forming multiple sample housings, removing material from each of the multiple sample housings up to the selected depth, and determining at least two sample sintering profiles that each produce a respective color within a range of the selected color at the selected depth. The method may further include determining, from the at least two sample sintering profiles, a sample sintering profile resulting in a smallest color change from a top surface to the selected depth, and designating the sample sintering profile as the sintering profile.

A method of manufacturing housings for electronic devices includes sintering a first set of ceramic housing precursors using a different sintering profile for each of the first set to form a set of ceramic housing samples, machining each of the ceramic housing samples to a selected depth, after machining each ceramic housing sample, and selecting from the set of ceramic housing samples a particular ceramic housing sample having a color within a color range. The method may further include determining the sintering profile associated with the particular ceramic housing sample, sintering a second set of ceramic housing precursors using the sintering profile associated with the particular ceramic housing sample, thereby forming a set of ceramic housings, and machining each of the ceramic housings to the selected depth. Each sintering profile of the different sintering profiles may include at least one of a different sintering duration or a different sintering temperature from each other sintering profile of the different sintering profiles.

The operation of machining each of the ceramic housings to the selected depth may include lapping each of the ceramic housings.

The operation of machining each of the ceramic housings to the selected depth may include removing the selected depth of material from an entire exterior surface of each of the ceramic housings.

The ceramic housing precursors of the first and the second sets of ceramic housing precursors may each include zirconia powder, a binder, and a pigment. The pigment may be a white pigment.

The color range may be defined by a color distance from a target color. The color range may be a range of colors that is perceptibly uniform to a target color.

A method of manufacturing a housing of an electronic device includes selecting a target color for the housing, sintering a housing precursor thereby forming a housing sample, successively machining the housing sample to various depths, determining a depth, from the various depths, having a color within a color distance of the target color, and machining the housing to the depth having the color within the color distance of the target color.

The color distance may correspond to a Delta E 76 value of less than or equal to about 2.0. The color distance corresponds to a range of perceptibly uniform colors.

The target color may have an L* value between about 80 and about 100, an a* value between about −10 and about 10, and a b* value between about −10 and about 10.

The housing precursor may include zirconia powder and a white pigment.

A housing for an electronic device may include a wall defining an exterior surface of the housing and comprising a ceramic material, and a pigment incorporated with the ceramic material. A color distance between a first portion of the ceramic material at or near the exterior surface and a second portion of the ceramic material about 0.5 mm below the exterior surface may have a Delta E 76 value of less than or equal to about 2.0. The Delta 76 value may be less than or equal to about 1.0, or less than or equal to about 0.5. The ceramic material may be zirconia, and the housing may be sintered.

The first portion may have a first b* value, and the second portion may have a second b* value that is less than about 0.5 units different from the first b* value, or less than about 0.3 units different from the first b* value.

A color of the first portion may have an L* value between about 75 and about 95, an a* value between about −15 and about 5.0, and a b* value between about −10 and about 10. A color of the second portion may have an L* value between about 75 and about 95, an a* value between about −15 and about 5.0, and a b* value between about −10 and about 10.

A method of manufacturing a housing of an electronic device includes heating, at a first temperature for a first duration, a ceramic housing precursor comprising a ceramic material and a pigment, thereby sintering the ceramic material and forming the housing. The ceramic material may comprise zirconia, and the pigment may comprise one or both of manganese oxide and cobalt oxide.

The method further includes heating the housing at a second temperature for a second duration, the second temperature lower than the first temperature and higher than a pigment stabilization threshold. The second temperature may be lower than a sintering threshold of the ceramic material, and the second duration may be longer than the first duration. The pigment stabilization threshold may be about 700° C. The first duration may be between about 1.5 hours and about 2.5 hours, and the second duration may be between about 1.5 hours and about 5.5 hours. The operation of heating the housing at the second temperature may not coarsen the microstructure of the housing.

The method further includes cooling the housing and removing material from the housing up to a selected depth.

A housing for an electronic device may include a pigmented ceramic wall defining a machined exterior surface of the housing. The pigmented ceramic wall may comprise zirconia. The pigmented ceramic wall may have been machined to remove at least about 0.25 mm of material. A color of the machined exterior surface of the housing may have an L* value between about 85 and about 95, an a* value between about −5.0 and about 5.0, and a b* value between about −5.0 and about 5.0. A color distance between the machined exterior surface of the housing and a portion of the ceramic material about 0.25 mm below the machined exterior surface may have a Delta E 76 value of less than or equal to about 1.0.

The color of the machined exterior surface of the housing may have an L* value between about 88 and about 93, an a* value between about −2.0 and about 3.0, and a b* value between about −1.5 and about 3.5, and the color distance between the machined exterior surface of the housing and the portion of the ceramic material about 0.25 mm below the machined exterior surface may have a Delta E 76 value of less than or equal to about 0.5.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
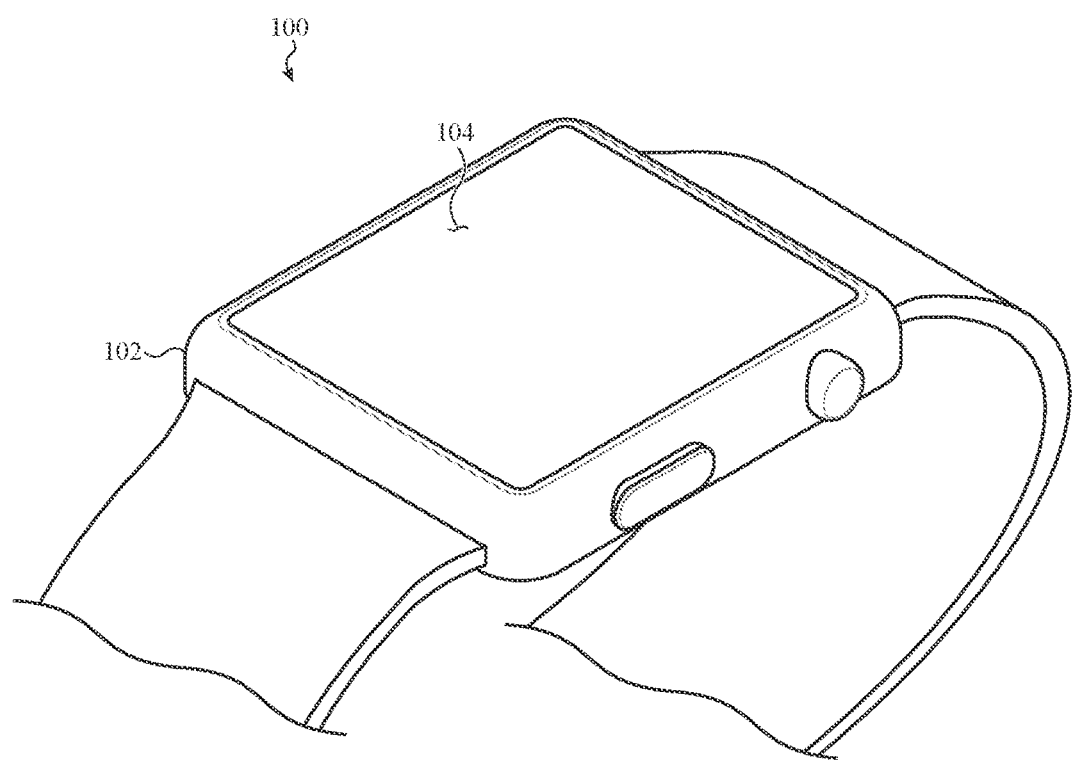
FIG. 1 shows an example electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Housings for electronic devices may be manufactured from various materials, such as metals, ceramics, plastics, or the like. Different materials may be colored or dyed in various ways to produce a housing of a desired color. In the case of ceramic materials, dyes or other pigments may be added to a ceramic material prior to sintering to produce a component of a selected color. In such cases, the sintering process, which includes heating the ceramic material, may sublimate or evaporate the dyes or pigments from the surface of the material (or otherwise remove the dyes or pigments or change the color of the dyes or pigments). This may produce components with colors that vary with a depth into the material. For example, the color of the exterior surface of the component after sintering may be different than the color at a depth below the exterior surface. The non-uniform color may be due to any chemical, physical, or other change(s) to the pigment that occur during sintering, including sublimation, evaporation, oxidation, or the like. Moreover, different sintering profiles (e.g., sintering temperatures and durations) may result in different color gradients. For example, one sintering profile may produce a certain color at a depth of 1 mm, and another sintering profile may produce a different color at a depth of 1 mm.

Manufacturing processes for housings, such as ceramic housings, may also include post-sintering processing steps, such as grinding, polishing, lapping, or other machining operations that remove material from the housings. Where the housings have a non-uniform color distribution through a thickness of the component (e.g., due to the sintering process), such machining operations may reveal a portion of the housing that has a different color than the exterior surface. Accordingly, in order to achieve a specified color on a ceramic housing that is machined after sintering, the specified color should be present at the depth to which the housing is machined. As noted above, however, different sintering profiles may result in different color gradients or hues at different depths of the housing. Moreover, different sintering profiles may produce different non-overlapping color sets. For example, for a given pigment, a first sintering profile may produce a certain color at a certain depth, whereas a second sintering profile may not produce that same color at any depth.

Described herein are techniques for evaluating and selecting a sintering profile to achieve a specified or selected color for a ceramic housing, and techniques for processing a ceramic housing in accordance with the selected sintering profile. For example, a manufacturing process for a ceramic housing may specify that a particular amount of material is to be removed from an exterior surface of the housing during a finishing process, and a design specification may specify that the housing, when finished, should have a particular color. A sintering profile may be determined that satisfies these criteria.

To determine the sintering profile (e.g., a sintering duration and temperature) that achieves the specified color at the specified depth, multiple housing samples may be sintered in accordance with various different sample sintering profiles. Each housing sample may then be machined to the specified depth, and the colors may be evaluated. The sintering profile that achieves the specified color (or is within a threshold color distance of the specified color) may be selected as the sintering profile for manufacturing the housings.

Additionally, the housing samples may be machined to different depths to determine how the color changes relative to depth for a given sintering profile. This information may also be considered when selecting a sintering profile for manufacturing the housings. For example, a sintering profile that produces less change in color for a given change in depth may be selected over a sintering profile that produces large changes in color for a given change in depth. This may result in greater color consistency between components, as differences in the machining depth (e.g., due to typical manufacturing and tool tolerances and error) may result in relatively less deviation from the specified color.

The example above describes selecting a sintering profile to achieve a specified color at a specified depth (with a specified pigment). However the processes described herein may also be used to determine any of these (or other) process variables. For example, if a pigment is specified, sample housings sintered in accordance with different sintering profiles may show what colors are achievable at various depths and with various sintering profiles. A particular color, machining depth, and sintering profile may then be selected based on the data from the sample housings. Details of these and other methods of manufacturing housings for electronic devices are discussed herein.

FIG. 1 shows an example device 100. The device 100 shown in FIG. 1 is a wearable electronic device (e.g., a smartwatch), but this is merely one representative example of a device that may be used in conjunction with the ideas disclosed herein. Other example devices include, without limitation, mobile phones, music/media players, tablet computers, laptop computers, watches (e.g., mechanical, electrical, or electromechanical), and the like. Moreover, while the ideas disclosed herein are primarily described with reference to a ceramic housing for a device (e.g., an electronic device), the ideas are also applicable to ceramic components other than device housings.

The electronic device 100 includes a housing 102 and a cover 104, such as a glass, plastic, or other substantially transparent material, component, or assembly, attached to the housing 102. The cover 104 may cover or otherwise overlie a display and/or a touch sensitive surface (e.g., a touchscreen). The device 100 may also include internal components, such as processors, memory, circuit boards, batteries, sensors, and the like. Such components, which are not shown, may be disposed within an internal volume defined at least partially by the housing 102.

Figure 2:
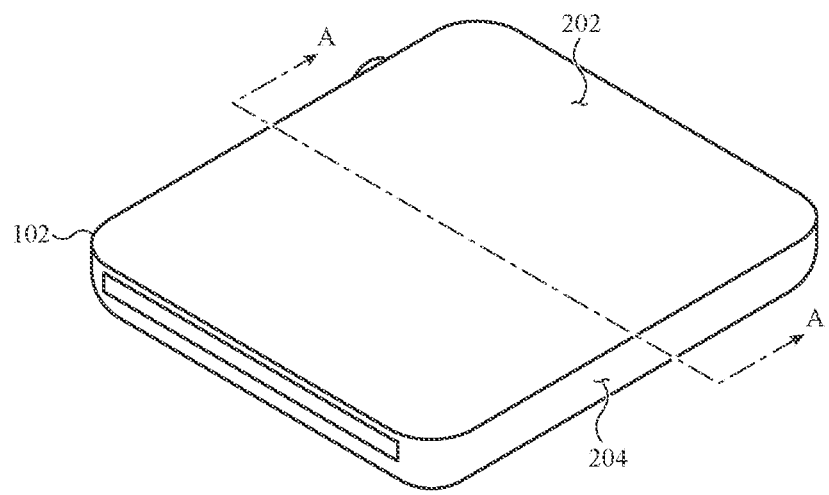
FIG. 2 shows a housing of the electronic device of FIG. 1.

The housing 102 may be formed from or include a ceramic material, such as zirconia, alumina, silicon carbide, silicon nitride, or the like. For example, the housing 102 may be or may include a ceramic component that defines at least one wall of the housing 102, as shown in FIG. 2. The housing 102 may be a single part formed from multiple components, such as multiple components fused, bonded, sintered, or otherwise attached to each other. In other cases, the housing 102 may be a unitary structure (e.g., a monolithic ceramic structure).

As noted above, the sintering process of a ceramic housing may result in a color gradient within the walls of the housing 102. Because the color gradient may depend, at least in part, on the sintering profile of the ceramic housing, the particular sintering profile used for the housing 102 may be selected to produce a desired color at a desired depth. To produce the housing 102 with the desired color and surface finish, the housing 102 may be machined (e.g., lapped, buffed, etc.) or otherwise processed down to the desired depth. Techniques for determining the sintering profile to use to achieve the desired color at the desired depth are discussed herein.

FIG. 2 shows an underside view of the housing 102, which may be a unitary (e.g., monolithic) ceramic component. Other configurations of the housing 102 are also possible, such as a multi-part ceramic housing, or a housing 102 that includes some ceramic portions and some non-ceramic portions (e.g., metal, plastic, glass, etc.). The housing 102 may include a wall 202 defining an exterior surface of the housing 102. The wall 202 may be the target color, and may be machined or otherwise processed to produce or reveal the target color on the wall 202. The wall 202 is one example portion of the housing 102 that may be subjected to the machining or processing operations. In some cases the entire exterior surface of the housing 102 is machined or otherwise processed to produce or reveal the target color. In some cases, the exterior surface of the housing 102 is machined to a uniform depth to produce a uniform color on the exterior surface of the housing 102.

Figure 3A:
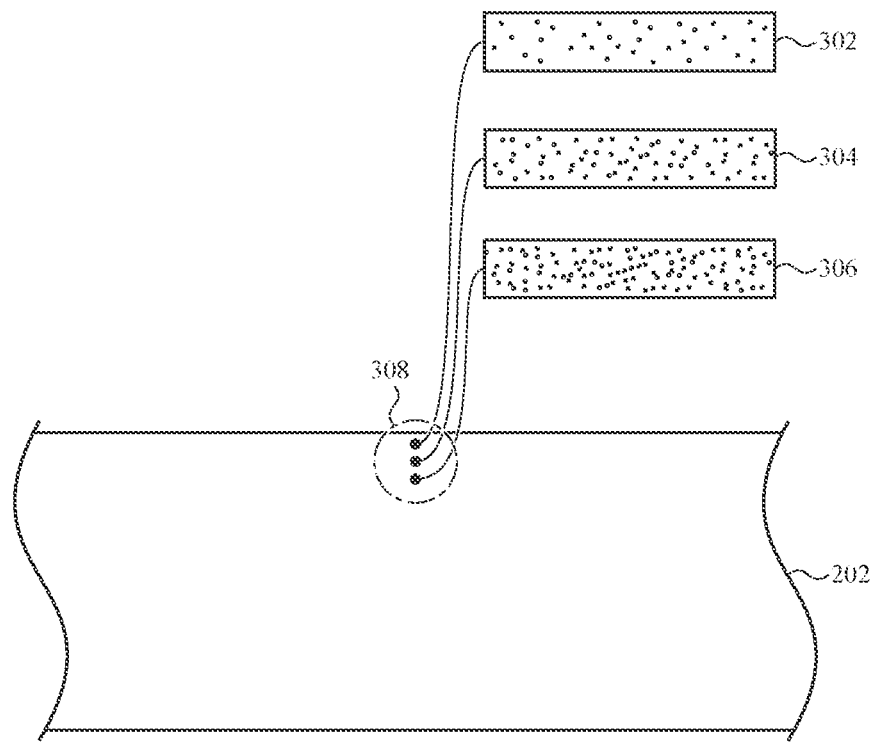
FIG. 3A shows a partial cross-sectional view of the housing of FIG. 2 viewed along line A-A in FIG. 2.

FIG. 3A is a partial cross-sectional view of the housing 102 (and in particular the wall 202) of FIG. 2, viewed along line A-A in FIG. 2. FIG. 3A illustrates how sintering (or other ceramic processing steps or techniques) may result in the wall 202 having different colors at different depths. For example, sintering the housing 102 may cause a pigment that has been incorporated in or applied to the housing 102 (prior to sintering) to sublimate, evaporate, or otherwise undergo a change in color (e.g., due to oxidation, chemical changes, carbonization, etc.). This may lead, for example, to a first color on the exterior surface (or top surface, as illustrated in FIG. 3A), and different colors at different depths of the housing 102 or wall 202. FIG. 3A illustrates the different colors (represented by different stippling patterns) that may occur at different depths within the wall 202 of the housing 102. More particularly, a first color 302 may occur on the exterior surface, a second color 304 may occur at a first depth, and a third color 306 may occur at a second depth. The stippling patterns shown in FIGS. 3A and 3B indicate differences in color, and may but need not correspond to a density of the pigment.

The color gradient of a housing 102 may also depend, at least in part, on the sintering profile used to form the housing 102. For example, certain combinations of sintering temperatures (e.g., a temperature at or above which a material being sintered fuses together, but below a melting temperature of the material) and durations may affect the extent to which a pigment sublimates, evaporates, or is otherwise removed from of the ceramic material. As another example, different certain sintering profiles may affect the extent to which a pigment becomes incorporated into the crystalline structure (or other microstructural or atomic arrangement) of the ceramic material. The differences in the color at the different depths may be due to different heating and cooling times and rates experienced at different depths within the material during sintering. For example, a surface of the material may experience a different rate of change of temperature than a deeper portion of the material, which may result in different sublimation, evaporation, or microstructural integration of the pigment (or other phenomena) at the different depths.

Because of the color gradient in the material, if a particular color at a particular depth is desired, such as to satisfy design and/or manufacturing criteria, it may be necessary to evaluate multiple sintering profiles to determine a sintering profile that produces the particular color at the particular depth. Techniques for determining a sintering profile (e.g., a sintering duration and temperature) are discussed herein.

Figure 3B:
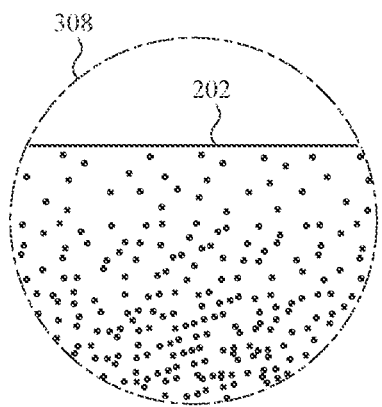
FIG. 3B shows a detail view of the housing cross-section of FIG. 3A.

Returning to FIG. 3B, the color difference or gradient in the housing 102 may be continuous or it may be stratified. For example, FIG. 3B shows a detail view of the area 308 in FIG. 3A, showing a continuous or smooth transition from one color (e.g., color 302 at the surface of the wall 202) through various different colors as the depth within the wall 202 increases. The actual colors of a housing (e.g., the exterior color and/or any colors at any depth), as well as the extent to which the color changes as a result of sintering, may vary based on many possible factors. For example, an initial color may be defined by the particular dye, paint, or other pigment that is used to color the ceramic (or simply by the makeup of the ceramic itself). The initial color may be any suitable or achievable color. Once sintered, the sintered color may differ from the initial color in various ways. For example, any one or any combination of the components in a CIELAB color space (also referred to as an L*a*b* color space) may differ between the initial color and the sintered color. For example, the housing 102 may have an initial color with a b* value about 0.0. After sintering, the housing 102 may have a b* value about 10 (making the housing 102 appear more yellow than the initial color). As another example, a housing 102 may have a lower L* (lightness) value after sintering than before sintering. While these descriptions describe color changes as perceived or measured on an exterior surface of the housing 102, the changes may extend into the depth of the housing walls as well, as described above. For example, after sintering, the housing 102 may be one color on the exterior surface, and another color at a depth within the wall, with neither color necessarily corresponding exactly to the initial color.

Figure 4:
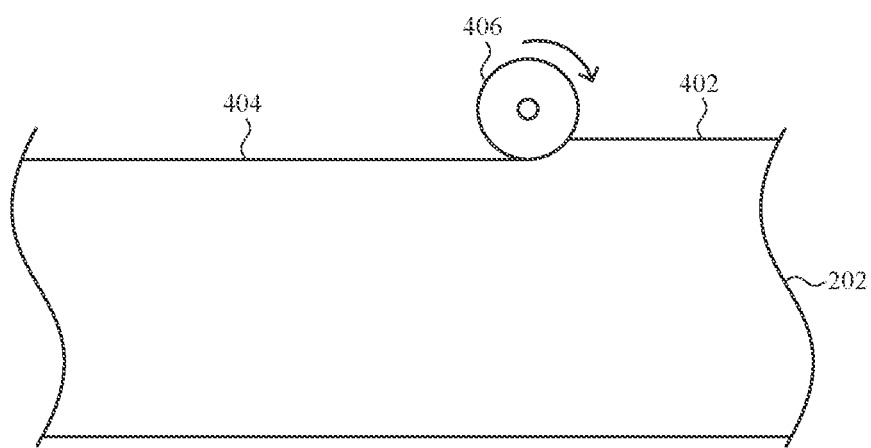
FIG. 4 shows a partial cross-sectional view of the housing of FIG. 2, viewed along line A-A in FIG. 2, illustrating an example manufacturing process.

Ceramic housings, such as the housing 102, may be processed after sintering. Processing may include machining operations that remove some material from the housing 102, such as lapping, grinding, polishing, milling, or the like. FIG. 4 shows a partial cross-sectional view of the wall 202 of the housing 102, viewed along line A-A in FIG. 2, showing the wall 202 undergoing a machining operation. More particularly, FIG. 4 shows a rotating tool 406 removing material from the wall 202. Due to the color gradient that may be formed as a result of sintering, the color on the newly exposed surface 404 may be different than the color on the original exterior surface 402 (which may itself be different than the color of the housing 102 pre-sintering). Moreover, as noted above, the depth to which the wall 202 is machined may determine the color of the newly exposed surface 404. For example, removing more material from the wall 202 may produce a different color than removing less material from the wall. While FIG. 4 illustrates a rotating tool 406, such as a grinding wheel or milling cutter, it is intended to represent any machining process that removes material from the housing 102, and should not be construed as limiting to a rotating tool or any other particular machining process.

Due to the color gradient produced in a sintered ceramic housing, a machined surface of the housing (e.g., surface 404) may have a different color than a surface that is machined to a different depth (or an un-machined surface such as surface 402). In order to produce housings having a uniform (e.g., a perceptibly uniform) color over the entire exterior or visible portion of the housing, the housing may have particular sizes, thicknesses, or other dimensions to allow a uniform material removal depth after sintering. For example, even if a certain surface does not require machining after sintering for structural or polishing reasons, that surface may be formed with additional material so that it can be machined to the same depth as other surfaces after sintering. In this way, a machining process may produce consistent and/or uniform colors over all of the portions of the housing that are machined.

The color gradient within a wall of a housing 102 may not be consistent at every location. For example, a first wall of the housing (e.g., the wall 202) may have one color gradient, and a side wall (e.g., wall 204, FIG. 2) of the housing may have a different color gradient. That is, the wall 202 may have a first color at a first depth, and the wall 204 may have the first color at a second, different depth. This may be due to factors such as differences in component thickness, differences in geometry, thermal properties, or the like. In such cases, the manufacturing process for the housing 102 may specify different material removal or machining depths for different portions of the housing, thus exposing the same color (or substantially the same color) on all of the surfaces of the housing 102.

Because of the changes in color that occur as a result of sintering and/or machining, sintered housings 102 may not be the same color as the initial color (e.g., the color of the pigment added to the ceramic material before sintering), or otherwise may not be a desired or specified color. Moreover, the effect of sintering on the color of the housing and/or the color gradient (e.g., the depth of the color changes, amount of color shift through the gradient, and the like) may not be easily predicted. For example, a longer sintering duration may not simply result in a deeper color gradient than a shorter sintering duration, but may also or instead result in a color gradient that spans entirely different colors. Thus, selecting manufacturing processing parameters, including, for example, machining depth, sintering duration, sintering temperature, and the like, may be complicated.

Figure 5:
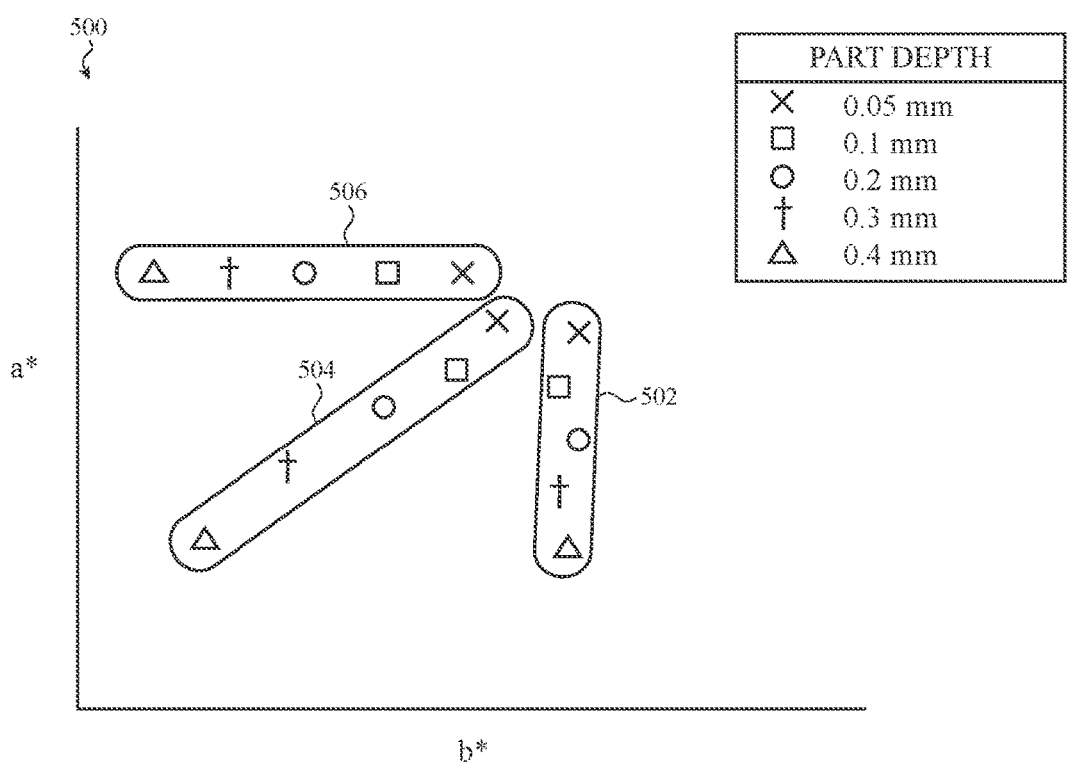
FIG. 5 shows an example plot of colors achieved using various sintering profiles.

In order to achieve a selected color, multiple sample housings 102 may be produced using different sintering profiles, and the color gradients may be evaluated (e.g., by progressively removing material and measuring the color at various depths) to produce a palette or range of potential colors and processing parameters that may be selected from, as shown and described with respect to FIG. 5. Once the palette or range of colors and processing parameters has been established, it is possible to select from among the processing parameters (e.g., sintering profiles, machining depths, etc.) and colors to optimize for particular variables or targets. For example, if a particular machining depth is mandated or otherwise selected, the target color may be selected from among the colors that are achievable or achieved at that particular machining depth. Or, if the machining depth may be selected in order to have a broader range of available colors, a target color may be selected from among all of the colors produced by the sample housings, and then the machining depth and sintering profile that corresponds to that color may be used in order to achieve the target color for subsequent housings.

One technique for establishing the palette or range of colors and processing parameters (e.g., depth, sintering profile, etc.) is to produce a plot that incorporates these variables. FIG. 5 shows an example plot 500 of colors and/or color gradients that may be achieved using various sintering profiles. The plot 500 shows the values, at various depths within a wall of a housing, of two dimensions in the CIELAB or L*a*b* color space. The x-axis of the plot 500 represents the b* value of a color, which describes a position on a blue-to-yellow scale, and the y-axis of the plot 500 represents the a* value of the color, which describes a position on a green-to-magenta scale. The L* value of the L*a*b* color space, which is not represented on the plot 500, represents a lightness of the color (ranging from black to white).

While FIG. 5 shows a* and b* values along the y-axis and x-axis, respectively, these are merely example values that may be plotted or otherwise used to establish or evaluate the palette or range of colors and processing parameters (e.g., depth, sintering profile, etc.). In some cases, for example, the y-axis or the x-axis may represent L* values instead of the a* or b* values shown in the plot 500. Also, other color spaces may be used. For example, if color is measured in an RGB color space, the x-axis may represent R values while the y-axis represents G values. In another plot, the x-axis may represent B values while the y-axis represents G values. In color spaces where more than two values are used to define a color (e.g., CIELAB, RGB, CMYK), multiple plots may be produced to illustrate or visualize the color gradients produced at different sintering profiles.

The first group of points on the plot 500 corresponds to a housing (e.g., a first housing) that was sintered according to a first sintering profile 502, the second group corresponds to a housing (e.g., a second housing) that was sintered according to a second sintering profile 504. and the third group corresponds to a housing (e.g., a third housing) that was sintered according to a third sintering profile 506. A sintering profile may include or specify any sintering parameters, including duration, temperature, temperature changes, and the like. For example, a sintering profile may specify a temperature and a duration for which the housing should be exposed to an environment of that temperature. As another example, a sintering profile may specify a starting temperature, an ending temperature, and a rate of change from the starting to the ending temperature. As yet another example, a sintering profile may specify multiple temperatures as well as durations associated with each temperature. Other examples of sintering profiles and sintering parameters that may be specified in a sintering profile are also possible. In some cases, some or all of the sintering parameters may be mandated by the composition of the material being sintered. For example, it may be necessary to sinter particular materials within particular temperature and duration ranges.

After sintering, the first, second, and third housings (as well as others, not shown) may be machined and color measurements may be taken at various depths. The color measurements may then be plotted to illustrate how the color changes with depth for a given sintering profile. The plot 500 (or the information used to generate the plot 500) may then be used to determine various processing parameters for the housing. For example, the plot 500 can be used to determine what sintering profile should be used to achieve a desired color at a desired depth. More particularly, for a given machining depth (which may be set in a manufacturing specification), the plot 500 can be evaluated to determine a sintering profile that achieves or is closest to a desired color at that depth. As another example, if the machining depth is not specified, the plot 500 may be used to select a machining depth and a sintering profile that produces a desired color. As yet another example, the plot 500 may be used to visualize what colors are possible after sintering, and to select a color from all of the possible colors. The associated depth and sintering profile may then be selected based on whichever color is selected.

The plot 500 also shows the amount of color change caused by a given sintering profile. For example, the first sintering profile 502 exhibits less color change, across the illustrated depths, than the second sintering profile 504. As another example, the third sintering profile 506 exhibits less color change along the a* axis (e.g., a green-to-magenta scale) than either the first or the second sintering profiles 502, 504.

This information may also be used to select a sintering profile. For example, if multiple sintering profiles produce similar colors at similar depths, the sintering profile that exhibits a smaller change in color across the depth range may be selected. As another example, if multiple sintering profiles produce similar colors at similar depths, the sintering profile that exhibits a smaller change along one axis or color scale may be selected. Accordingly, deviations in the amount of material removed from a housing (e.g., due to typical machining tolerances) may result in relatively less color variation between housings. As a specific example, the first and second sintering profiles 502, 504 both exhibit a similar color at about 0.1 mm deep. Because the overall deviation in color in the first sintering profile 502 is less than the overall deviation in color in the second sintering profile 504, the first sintering profile 502 may be selected or designated for manufacturing or production of housings. As another example, the second and third sintering profiles 504, 506 both exhibit a similar color at about 0.05 mm deep. Because the overall deviation in a* values is less for the third sintering profile 506, the third sintering profile 506 may be selected or designated for manufacturing or production of housings.

For simplicity, FIG. 5 illustrates three sintering profiles. However, any number of sintering profiles may be tested and plotted. Also, it may not be necessary to visually plot the information shown in the plot 500. Rather, the information may be stored, evaluated, and/or processed in other ways. For example, color values at various depths may be used to mathematically calculate a color distance between an ideal or target color and all achievable colors at a given machining depth.

Figure 6A:
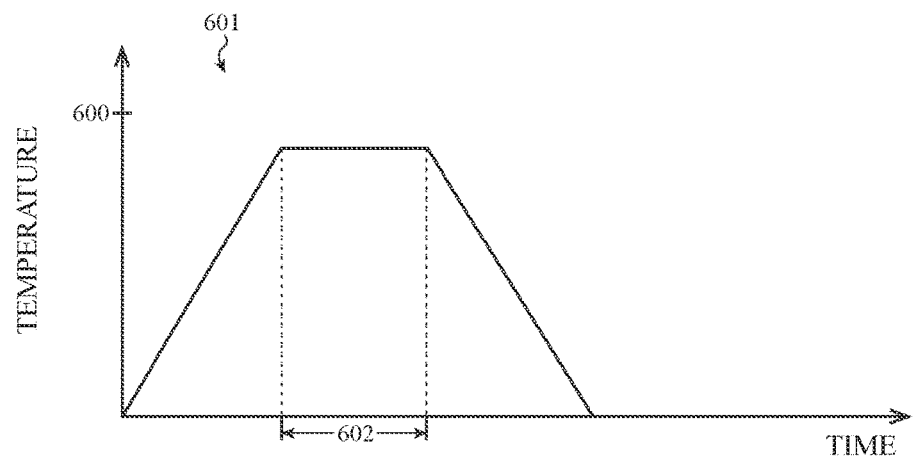
FIG. 6A shows an example sintering profile.

As noted above, some sintering profiles may produce less color variation across a range of depths within the component than other sintering profiles. For example, FIG. 6A shows a temperature vs. time plot illustrating a conventional sintering profile 601. This profile may include heating a ceramic component (e.g., a green body ceramic component) at a sintering temperature 600 (e.g., a temperature at or above which fusion of the ceramic material occurs without melting the material), allowing the ceramic component to remain in or at that temperature for a duration 602, and then allowing the ceramic component to cool to an ambient temperature.

However, this sintering profile may not produce a color gradient having a suitably small variation. In particular, this sintering time and duration may be insufficient for a pigment to become evenly incorporated with the ceramic material through a depth range. For example, when a pigmented ceramic material is heated, the heat may cause the pigment to become incorporated into the crystal lattice (or other microstructure) of the ceramic material. But a sintering profile that is sufficient to sinter the ceramic material may not be sufficient to fully stabilize the pigment (chemically, physically, or chromatically) or otherwise achieve a target color gradient through the material (e.g., a target maximum color distance between two depths below a surface of the component). Yet simply increasing the sintering temperature or duration to further stabilize the pigment may be detrimental in other ways. For example, extending the sintering duration may coarsen the microstructure of the ceramic material, resulting in a component having a relatively lower fracture resistance as compared to a ceramic with a finer microstructure.

Accordingly, an alternative sintering profile may be used that both sinters the component and stabilizes the pigment to produce a target color gradient within the ceramic material. Examples of target color gradients are described below. However, as noted above, the resulting color gradient may be smaller (e.g., having less deviation in color) when the alternative sintering profile is used as compared to the sintering profile shown in FIG. 6A.

Figure 6B:
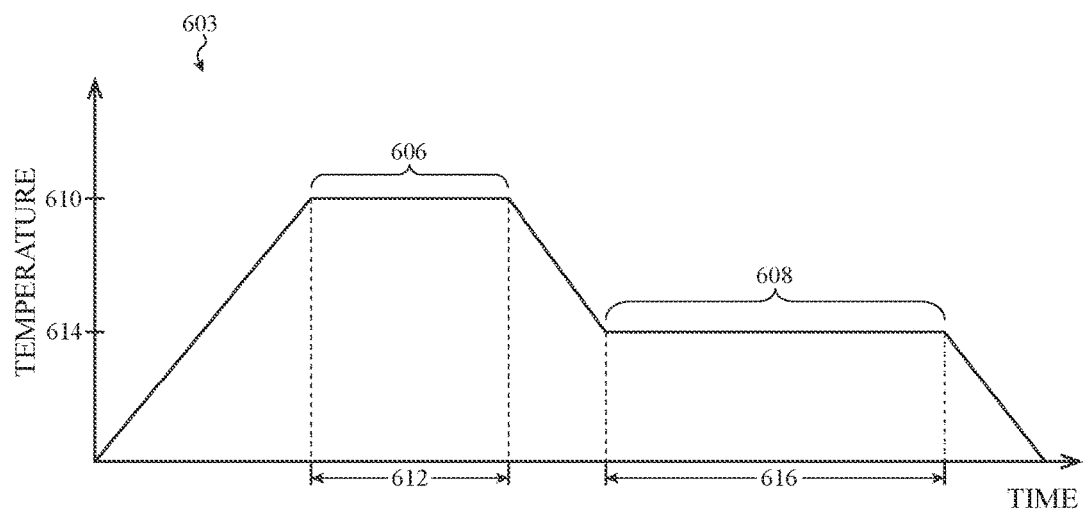
FIG. 6B shows an example two-stage sintering profile.

FIG. 6B shows a temperature vs. time plot illustrating a stepped sintering profile 603 that further stabilizes a pigment as compared to the sintering profile shown in FIG. 6A. In particular, a ceramic component (e.g., a green body ceramic component) is subjected to a first heating stage 606 in which the component is heated at a first temperature 610 for a first duration 612. Thereafter, in a second heating stage 608, the component (or the environment around the component) is cooled to a second temperature 614 that is lower than the first temperature. The component is then heated at the second temperature 614 for a second duration 616.

The first temperature 610 may correspond to a temperature that is suitable to sinter the ceramic material. For example, the first temperature 610 may be at or above a sintering threshold of a ceramic material. A sintering threshold may be a temperature at which the ceramic material fuses together, or it may be a temperature at which microstructural changes in the material occur. A sintering threshold may also correspond to a temperature below which sintering (e.g., fusion of the ceramic material) does not substantially occur or does not occur at all.

The first temperature 610 and the first duration 612 may be selected in any suitable manner, and may depend on various factors or considerations. For example, the first temperature 610 and duration 612 may depend on the particular type of ceramic material being sintered (e.g., zirconia), a size of the component (e.g., a thickness of the thickest or thinnest portion), a target strength, a target component size, or the like. More particularly, the first temperature 610 and duration 612 may be selected so that the final sintered product has a target microstructure, a target strength, a target size, or the like. The values for the first temperature 610 and the first duration 612 may be determined experimentally, such as by sintering sample components using different first temperatures and durations and evaluating each component to determine which sintering profile produces components with the target properties.

The first temperature 610 and the first duration 612 may be selected so as to fully sinter the component, as the second heating stage 608 may not further fuse or bond the ceramic material. Where the ceramic material is zirconia, the first temperature 610 may be in a range of about 1400-1500° C., and the first duration 612 may be in a range of about 1-3 hours or about 1.5-2.5 hours. Other materials, temperatures, and durations are also possible.

The second temperature 614 may correspond to a temperature that is lower than a sintering threshold for the ceramic material, but is still elevated from an ambient temperature. For example, where the ceramic material is zirconia, the second temperature 614 may be less than or equal to about 1400° C., about 1300° C., about 1000° C., or about 950° C. In some cases, the second temperature 614 may be between about 900° C. and 1000° C., or between about 1200° C. and 1400° C. In some cases, the second temperature 614 may be above a pigment stabilization threshold temperature. A pigment stabilization temperature may be a temperature below which the pigment may not further stabilize. Pigment stabilization may refer to any type of stabilization, including for example increased uniformity and/or homogeneity of color, chemical stability, physical stability, or any combination of these phenomena. In some cases, pigment stabilization may refer to the uniformity and/or homogeneity of the color of the pigmented material, regardless of the particular chemical, physical, or other phenomena that produces the uniformity and/or homogeneity. In some cases, a pigment stabilization temperature may be a temperature below which the pigment does not appreciably become incorporated with the microstructure of the ceramic material. Because the level or degree of microstructural incorporation of a pigment may affect the color of the pigmented material, tying the pigment stabilization temperature to a temperature below which the pigment does not appreciably become incorporated with the microstructure of the ceramic material may result in greater color uniformity and/or homogeneity.

The stabilization threshold temperature may depend and/or be selected at least in part on the particular type of pigment and ceramic material. For example, some pigments, ceramics, or particular combinations of ceramics and pigments may have different threshold temperatures. In some cases, such as for pigments containing manganese oxide and cobalt oxide, the stabilization threshold temperature may be between about 900° C. and about 700° C., and more particularly may be about 900° C., about 800° C., or about 700° C.

The second duration 616 may be selected in conjunction with the second temperature 614 to result in a ceramic component with a target color gradient. In order to determine the second duration 616 for a particular ceramic component, multiple sample components may be subjected to sintering profiles with second heating stages 608 with varying durations (and optionally at varying temperatures). Those components may be subsequently tested to determine a duration that results in the target color gradient. In some cases, the second duration 616 corresponds to a duration that maximally stabilizes the pigment, such that a longer duration will not produce a significantly tighter color gradient. This particular duration may also be determined experimentally by subjecting multiple components to a sintering profile with a second heating stage 608 having different durations, and determining the duration at which the resulting color gradients cease becoming tighter. In some cases, the second duration 616 may be between about 1 and about 5 hours, between about 4 and about 7 hours, between about 6 and 10 hours, or any other suitable duration. The second duration 616 may be any particular duration encompassed by these ranges as well (such as about 1 hour, about 5 hours, about 10 hours, or the like).

In some cases, instead of cooling the component from the first temperature 610 directly to the second temperature 614, as shown in FIG. 6B, the component is cooled to an ambient temperature or another temperature (e.g., an intermediate temperature) below the first temperature 610, and is thereafter reheated at the second temperature 614. The component may remain at the intermediate temperature for any suitable duration, including momentarily (e.g., less than about 10 seconds), or for longer periods (e.g., 1 hour, 2 hours, 5 hours, 24 hours, or longer). The second heating stage 608 may stabilize and/or homogenize the pigment in the same manner whether or not it is contiguous with the first heating stage 606.

In some cases, instead of using a sintering profile with multiple heating stages, as shown and described with respect to FIG. 6B, the stability of a pigment may be increased relative to a conventional sintering profile by using a profile similar to the profile shown in FIG. 6A but at a lower temperature and for a longer duration in order. For example, with reference to FIG. 6A, instead of sintering the component at about 1400° C. for about 1-2 hours, the component may be sintered at about 1200° C. for 3-5 hours, or at about 1300° C. for 2.5-4.5 hours. The latter sintering profiles may result in a suitably sintered component having a tighter color gradient than the profile shown in FIG. 6A.

In any of the sintering profiles described herein, a debinding operation may be performed prior to the sintering profile. In particular, before subjecting a green body ceramic component to a sintering profile, the component may be heated at a temperature lower than a sintering threshold for the ceramic material in order to burn off or otherwise remove a binder material. As another example, a green body ceramic component may be subjected to a sintering profile without a separate debinding step, and debinding may occur as part of (e.g., during) the sintering profile.

Also, the ramp-up and ramp-down segments of the sintering profiles 601, 603 may have any suitable parameters (e.g., slope, curvature, duration, etc.), and may be controlled in various ways. For example, a ceramic component may be placed in a furnace or other heating environment that is already at a desired temperature, and the ceramic component may heat to a maximum temperature at a rate dictated by the characteristics of the component and the environment (e.g., the composition of the material, humidity of the environment, the shape of the component, etc.). As another example, a ceramic component may be placed into a furnace or other heating environment that is at a different temperature than a sintering temperature (e.g., an ambient temperature, a temperature higher or lower than the sintering temperature, etc.), and the temperature of the environment may be controlled to produce a different ramp-up rate. Similar techniques may be applied to ramp-down segments. For example, in order to ramp-down to a different temperature (e.g., from the first temperature to the second temperature or from the second temperature to ambient temperature), a furnace may be turned off and the component may be allowed to naturally cool while inside the furnace, or the furnace may be adjusted to different (e.g., lower) temperatures to more gradually cool the component. As yet another example, the component may be removed from the furnace or other heating environment and forcibly cooled or quenched in a medium, such as air, that is at or below ambient temperature.

In some cases, the ramp-up segments of the sintering profiles 601, 603 correspond to a heating rate about 100° C. per hour. As noted above, this heating rate may apply to the component itself (e.g., the component may be heated so its temperature rises at about 100° C. per hour), or it may apply to an environment around the component (e.g., the temperature inside a furnace may be increased at about 100° C. per hour).

As noted above, the two-stage sintering profile and the lower temperature, longer duration sintering profiles may produce tighter color gradients as compared to a conventional sintering profile. In some cases, the color gradients produced using these modified sintering profiles may be selected to produce or achieve a particular color gradient (e.g., a target color gradient). A target color gradient may be defined in various ways. For example, a target color gradient may be specified as a color gradient having a color distance between a surface color and a color at a specified depth that is less than a threshold or maximum allowable color distance. Color distance may be represented by a mathematical distance from one color to another color, and may be calculated or determined in any appropriate way using any appropriate metric. One example color distance metric is Delta E 76 which measures a distance between two colors in the L*a*b* color space. Delta E 76 may also be referred to as CIE76 or $\Delta E^*_{ab}$, and corresponds to a color distance formula promulgated by the International Commission on Illumination in 1976. Color distance values may be dimensionless numbers, where higher values represent greater distance. Other color distance metrics or other ways of measuring or characterizing color distance may also be used (e.g., Delta E 94 or Delta E 2000).

In some cases, the target color gradient for a sintered component may be a gradient in which a maximum Delta E 76 color distance between an exterior surface of a component and a depth of 0.5 mm within the component is about 1.2, or 1.15. Other target color gradients are also possible, such as smaller or larger color distances, as well as smaller or greater depth ranges. Moreover, after machining, the sintered component may still exhibit a color gradient. For example, a housing or other component may be machined to remove about 0.25 mm of material (or other amounts of material, as described herein) to produce a machined exterior surface of the housing. After removal of this material, a color distance between the machined exterior surface of the housing and a portion of the ceramic material at a distance below the machined exterior surface (e.g., 0.25 mm) may have a Delta E 76 value of less than or equal to about 2.0, 1.0, 0.5, 0.25, or any other suitable value.

Figure 7:
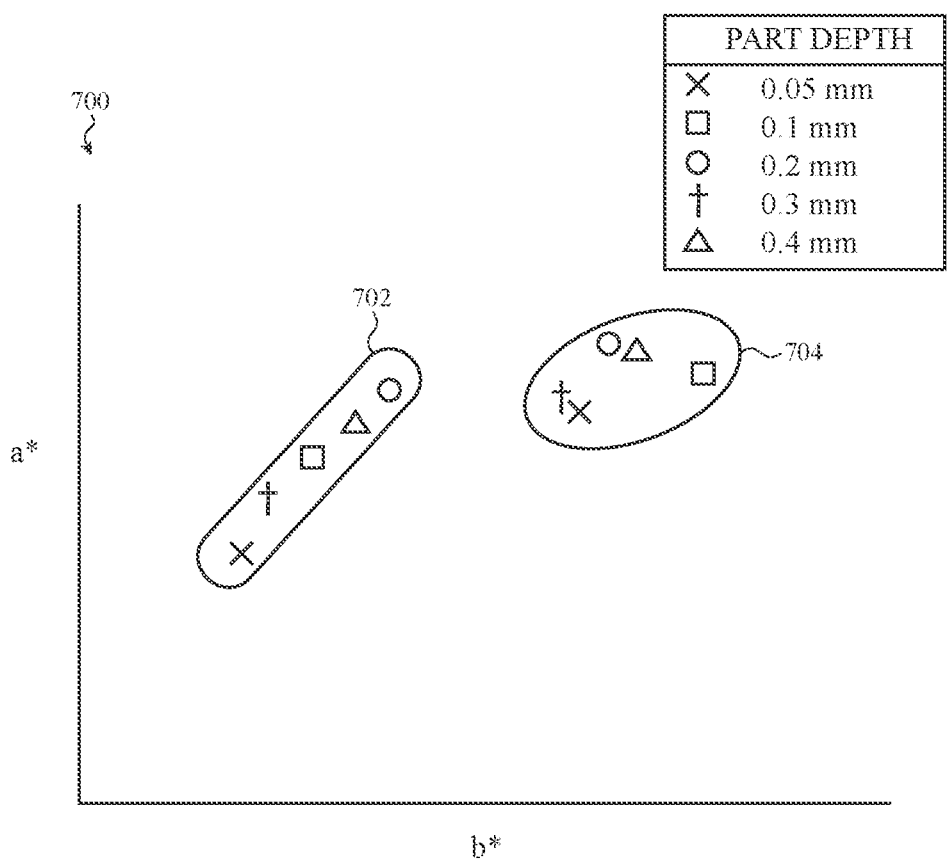
FIG. 7 shows an example plot of colors achieved using the sintering profiles of FIGS. 6A-6B.

FIG. 7 shows an example plot 700 of colors and/or color gradients that may be achieved using various sintering profiles. In particular, the first group of points 702 represents a color gradient of a component that was sintered according to a conventional sintering profile (e.g., the sintering profile 601), while the second group of points 704 represents a color gradient of a component having the same composition but sintered according to a stepped sintering profile (e.g., the sintering profile 603). Similar to the plot 500, the plot 700 shows the values, at various depths within a wall of a component (e.g., a housing), of two dimensions in the CIELAB or L*a*b* color space. The x-axis of the plot 700 represents the b* value of a color, which describes a position on a blue-to-yellow scale, and the y-axis of the plot 700 represents the a* value of the color, which describes a position on a green-to-magenta scale.

As shown in FIG. 7, the component sintered according to the stepped sintering profile has a tighter color gradient than the component sintered according to the conventional sintering profile. For example, the maximum Delta E 76 color distance observed between a depth of about 0.05 mm and about 0.4 mm of a component sintered using the conventional sintering profile may be about 4.5. This gradient may be so large that the varying machining depths required for an individual component result in a component with perceptibly inconsistent coloring. Further, the gradient may be so large that the varying machining depths across multiple components (e.g., due to the variations in the sizes of the components prior to machining, and thus the variations in the depth to which any given component is machined) results in components of perceptibly different colors.

The component sintered according to the stepped sintering profile, on the other hand, has a tighter color gradient. For example, the stepped sintering profile described above may produce components with a maximum Delta E 76 color distance between a depth of about 0.05 mm and about 0.4 mm of less than about 2. In some cases the Delta E 76 color distance between a depth of about 0.05 mm and about 0.4 mm is 1.5 or less, such as 1.2 or less. Accordingly, components produced using the stepped sintering profile discussed above (or the low-temperature sintering profile discussed above) may have only minor and potentially imperceptible color variations within a given component and among multiple components.

Figure 8:
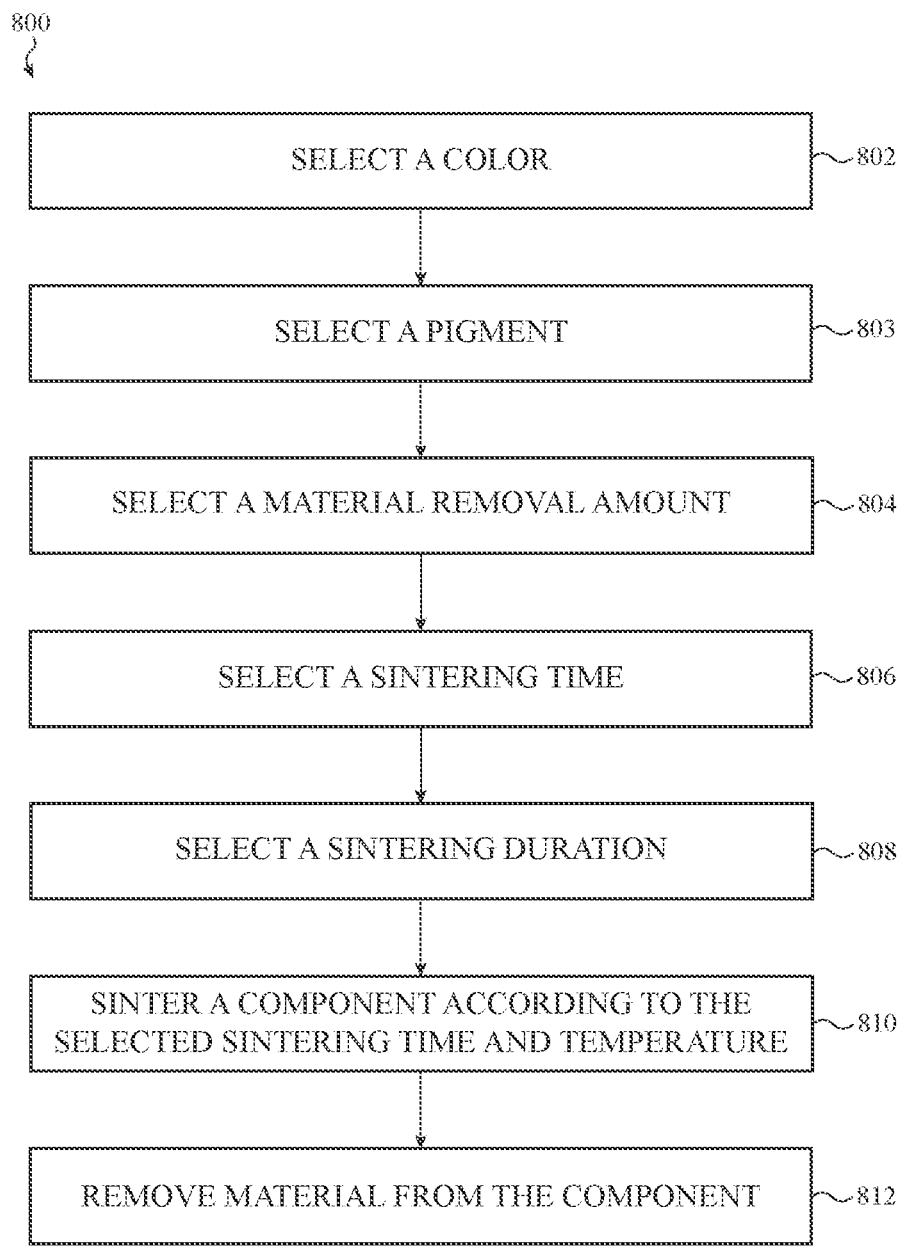
FIG. 8 shows an example process of manufacturing an example housing

FIG. 8 shows an example process 800 of manufacturing an example housing, such as the housing 102 of FIG. 1. The process 800 may be used to select or determine a sintering profile for housings based on a target color. The process 800 may also be used to select or determine a machining depth for housings based on a target color. The process 800 may also be used to select or determine a target color given a range of possible colors and possible machining depths. While the process 800 describes certain operations, not all operations are necessarily required in all embodiments. For example, some of the described operations may be omitted and other operations may be added in various embodiments. Moreover, the operations may be reordered in various embodiments.

At operation 802, a target color is selected. The color may be any appropriate color, and may be defined by any appropriate parameters. For example, the selected color may be defined in the L*a*b* color space (e.g., it may be defined by a set of L*a*b* values), or any other suitable color space or color naming convention (e.g., L*C*h, RGB, CMYK, HSV, HSL, Pantone matching system, etc.). In one embodiment, the target color has an L* value between about 75 and 95, an a* value between about −15 and about 5.0, and a b* value between about −10 and about 10. In another embodiment, the target color has an L* value between about 85 and about 95, an a* value between about −5.0 and about 5.0, and a b* value between about −5.0 and about 5.0. In yet another embodiment, the target color has an L* value between about 88 and about 93, an a* value between about −2.0 and about 3.0, and a b* value between about −1.5 and about 3.5. In yet another embodiment, the target color has an L* value between about 38 and about 48, an a* value between about −0.5 and about 4.5, and a b* value between about −4.0 and about 1.0. In yet another embodiment, the target color has an L* value between about 46 and about 52, an a* value between about −0.5 and about 2.0, and a b* value between about −0.0 and about 2.5.

The selected target color may be specified as a range of values within a color space, such as any of the color ranges described above (or other ranges). Alternatively, the selected target color may be specified as particular target color within a color space, such as a value falling within one of the ranges described above.

The selected target color may also be specified as target value within a color space plus a maximum color distance (e.g., a Delta E 76 color distance) from the target value. The maximum color distance used to define or specify a maximum deviation from a target color may be any suitable value. In some cases, the maximum color distance may represent a color distance that cannot be perceived by an unaided human eye, or that is generally accepted to be indistinguishable by observers. For example, a target color may specify a maximum color distance of less than about 0.5, less than about 0.75, less than about 1.0, or less than about 2.0. As one specific example, the target color may be defined as a color within a color distance of 1.0 (using the Delta E 76 distance metric) to a color value of 80, 5.0, 5.0 (in L*a*b* coordinates). Other values are also possible.

The selected target color may also be specified as or limited to a maximum color distance between a surface color and a color at a specified depth. For example, as noted above, it may be desirable to select a sintering profile that produces a relatively smaller range of colors through the depth of the material. This may help ensure that different components, which may be machined to slightly different depths due to differences in initial component size or the like, have similar colors once they are machined. More particularly, a machining or finishing process may result in the removal of between 0.05 mm and 1.5 mm from any given component. A sintering profile that produces components having a wider variation of colors between a depth of 0.05 mm and 0.5 mm may result in components with noticeably different colors, whereas a sintering profile that produces a smaller variation of colors may produce more consistent colors across multiple components after machining or other finishing operations. In some cases, as noted above, the maximum color distance between an exterior surface of a component and a depth of 0.5 mm within the component is about 1.2, or 1.15.

At operation 803, a pigment may also be selected for the housing. The pigment may be selected based on the target color. For example, a pigment having the target color (or that exhibits the target color when incorporated with a ceramic precursor prior to sintering) may be selected. In some cases, the selection of the pigment may be revised after determining that a target color cannot be achieved at a suitable depth within the wall of the component with an initial pigment selection. For example, a pigment that corresponds to the target color prior to sintering may not be sufficiently similar to the target color after sintering (at least at an acceptable depth within the wall). Accordingly, after determining that an initial pigment does not produce the target color after sintering, a different pigment may be selected. In one example, an initial pigment intended to produce a white color may shift too far towards a blue color after sintering. Accordingly, a pigment having a more yellow initial hue may be selected.

At operation 804, a material removal amount is selected for a housing. The material removal amount, or the depth to which a housing is machined after sintering, may depend on various factors, such as the amount of material that is to be removed to achieve a desired surface polish, or an amount of material that is to be removed in order to achieve a target size or shape of the housing. The material removal amount may also or instead be selected based on the color gradient within a wall of the housing after sintering, as described above. Thus, the material removal amount may be selected based on the available or achievable colors, rather than a manufacturing specification or requirement.

A sintering profile may be determined. Determining the sintering profile may include one or both of selecting a sintering duration (e.g., operation 806, described below) and selecting a sintering temperature, such as a temperature that results in fusion and/or microstructural changes of the ceramic material (e.g., operation 808, described below).

At operation 806, a sintering duration is selected. The sintering duration may be part of a sintering profile, along with the sintering temperature and/or other parameters. In some cases, various housing samples are sintered for different sintering durations to determine the resulting color gradients within the walls of the housings, as described above with reference to FIG. 5. The sintering duration that produces a selected color at a selected depth may then be selected for manufacturing the housings. For example, a sintering duration corresponding to one of the sintering profiles 502, 504, 506 (FIG. 5) may be selected based on a determination that the target color is achieved at a selected depth using that sintering profile. More particularly, if the target color is achieved at a depth of 1.0 mm of a housing sintered according to the first sintering profile 502, the sintering duration corresponding to the first sintering profile 502 may be selected.

The sintering duration may be any suitable duration, such as between about 1 hour and about 5 hours. In some cases, the sintering duration is about between about 1 hour and about 2.5 hours.

At operation 808, a sintering temperature is selected. The sintering temperature may correspond to a temperature that is below a melting temperature of the material but causes the material (e.g., a powered or particulate material that is otherwise unfused) to fuse together. The sintering temperature may be part of a sintering profile along with the sintering duration and/or other parameters. In some cases, various housing samples are sintered at sintering temperatures to determine the resulting color gradients within the walls of the housings. The sintering temperature that produces a selected color at a selected depth may then be selected for manufacturing the housings. Continuing the example from above, if the target color is achieved at 1.0 mm of a housing sintered according to the first sintering profile 502 (FIG. 5), the sintering temperature corresponding to the first sintering profile 502 may be selected.

The sintering temperature may be any suitable temperature, such as between about 1300° C. and about 2000° C. In some cases, the sintering temperature is about between about 1450° C. and about 1700° C.

The sintering duration and temperatures may be determined together. For example, multiple housing samples may be sintered in accordance with various sample sintering profiles (e.g., combinations of temperature and duration), and the sintering profile (e.g., the particular temperature and duration) that produces a selected color at a selected depth may then be selected or determined for manufacturing the housings. Also, other parameters of a sintering profile may be determined instead of or in addition to the sintering duration and temperature, such as starting and ending temperatures, temperature changes, heating/cooling rates, and the like.

The selection or determination of the parameters described above (e.g., color, pigment, material removal amount, and sintering profile) may include sintering a batch or a set of ceramic housing precursors (as described with respect to FIG. 5) to form a set of ceramic housing samples, and then evaluating the housing samples to select or determine the processing parameters. In particular, each of the housing samples may be machined to various depths, and the colors at each depth may be measured. This information may then be used to determine the sintering profile, material removal amount, color, and/or pigment.

As one specific example, determining the sintering profile (e.g., the sintering duration and temperature, operations 806, 808) may include selecting the sintering profile from a set of sintering profiles, each producing a different color at a different depth. For example, as described above with respect to FIG. 5, a set of sample housings may be sintered according to different sintering profiles, and a particular sintering profile may be selected from among the set of sample sintering profiles. In some cases, a sintering profile that does not correspond exactly to one of the sample housings may be selected. For example, after testing multiple sintering profiles, it may be determined that a change to a sample sintering profile may produce a desired color at a desired depth. In this way, a sintering profile that was not necessary one of the sample sintering profiles may be interpolated from the sample data and used as the sintering profile for manufacturing the housings.

As another example, determining the sintering profile may include selecting a target color and a machining depth. A set of sample sintering profiles (as described with respect to FIG. 5) may then be used to select, as the sintering profile, the sample sintering profile that produces a housing having a color within a range of the target color at the machining depth.

In some cases, selecting the sintering profile may include selecting a sintering duration, and then determining a sintering temperature that produces a color within a range of the selected color at the selected depth. The sintering duration may be selected based on numerous factors, such as manufacturing constraints, material properties or specifications, strength requirements, dimensional requirements (e.g., amount of green body shrinkage), particle size of a ceramic powder, or the like.

Alternatively, selecting the sintering profile may include selecting a sintering temperature, and then determining a sintering duration that produces a color within a range of the selected color at the selected depth. The sintering temperature may be selected based on numerous factors, such as manufacturing constraints, material properties or specifications, strength requirements, dimensional requirements (e.g., amount of green body shrinkage), or the like.

In another example parameter selection process, a machining depth is established by a manufacturing specification, and each housing sample of the set of housing samples is machined to the established depth. A housing sample that is within a range of a target color (or that is closest to a target color) after the machining may then be selected, and the sintering profile that was associated with that housing sample may be determined. That sintering profile may then be established as the sintering profile to use when producing the production housings. The color range may be defined as a particular absolute color distance value (e.g., Delta E 76, described above) from the target color. The color range may be a range of colors that is perceptibly uniform to a target color (e.g., a range that is less than a just-noticeable difference in color to the target color).

After selecting the desired color, material removal amount, and sintering profile (e.g., operations 802-808), the selected pigment may be added to a ceramic material to form a ceramic housing precursor. The pigment may be added to the ceramic material in various ways. For example, the pigment (e.g., a white pigment) may be mixed with a ceramic powder (e.g., zirconia powder) or other ceramic feedstock, and then the mixture of the pigment and the ceramic powder may be formed into a green body component (e.g., an un-sintered component formed into a shape that will produce a properly shaped and sized housing component after sintering). As another example, a ceramic powder or other ceramic feedstock may be formed into a green body component, and then the pigment may be applied to an outer surface of the green body component (e.g., via spraying, dipping, brushing, vapor or chemical deposition, or the like). The ceramic material may absorb the pigment such that the pigment penetrates at least partially through or into the wall of the housing.

Forming the ceramic housing precursors may also include mixing the ceramic powder (or other feedstock) and the optional pigment with other components, such as binders, plasticizers, dispersants, surfactants, or the like. Binders, for example, may retain the green body component in the desired shape prior to and/or during processing, such as during sintering and/or debinding. Pigments may include any suitable materials, compositions, coloring agents, or the like. For example, pigments may include coloring agents such as titanium dioxide, iron oxide, cobalt oxide, magnesium oxide, or any other coloring agents or combinations thereof.

At operation 810, the ceramic precursor is sintered in accordance with the selected sintering profile (e.g., the selected sintering duration and temperature, operations 806, 808). As noted above, the selected sintering profile may produce a selected color at a selected depth within a wall of the housing. The ceramic precursor may be sintered in a furnace, oven, or with any other suitable sintering equipment. Sintering the ceramic precursor may form the ceramic housing.

At operation 812, after the ceramic precursor is sintered to form the housing, material is removed from the housing up to the selected depth. The selected depth may be any suitable value, such as about 0.05 mm, 0.1 mm, 0.25 mm, 0.5 mm, or any other suitable value. The material may be removed in any appropriate way, such as machining (e.g., lapping, grinding, polishing, milling, etc.), cutting (e.g., with a laser, water jet, or plasma torch), ablation (e.g., laser ablation), or the like. As noted above, the sintering profile and/or parameters are selected to achieve a selected color at a selected depth. Accordingly, removing the material up to the selected depth at operation 812 results in a housing having the selected color.

Figure 9:
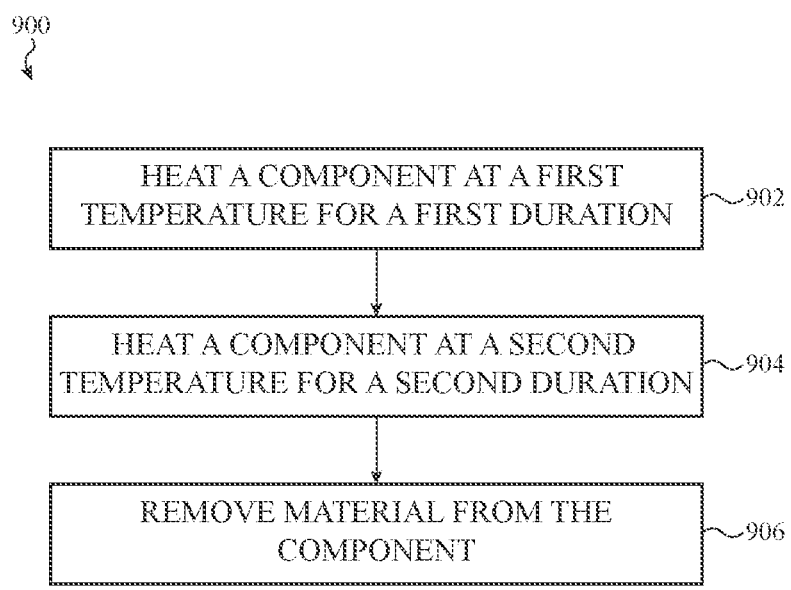
FIG. 9 shows an example process of manufacturing an example housing using a two-stage sintering profile.

FIG. 9 shows an example process 900 of manufacturing an example housing, such as the housing 102 of FIG. 1. The process 900 may be used to sinter a ceramic material and stabilize a pigment incorporated with the ceramic material to produce a target color gradient, as described above with respect to FIGS. 6A-7. While the process 900 describes certain operations, not all operations are necessarily required in all embodiments. For example, some of the described operations may be omitted and other operations may be added in various embodiments. Moreover, the operations may be reordered in various embodiments. In some cases, the sintering processes 900 may be used in conjunction with the process 800 described with respect to FIG. 8. For example, the stepped sintering profile may be used to sinter the housing samples used to select or determine a machining depth for housings based on a target color, or to select or determine a target color given a range of possible colors and possible machining depths.

At operation 902, a component (e.g., the housing 102 in FIG. 1, or a portion thereof) is heated at a first temperature for a first duration. The heating operation 902 may correspond to the first heating stage 606 described above with respect to FIG. 6B. The first temperature and the first duration may be selected so as to substantially fuse or sinter a green body part comprising a ceramic material. For example, when the component comprises zirconia, the first temperature may be in a range of about 1400-1500° C. and the first duration may be in a range of about 1-2 hours. Other durations and temperatures are also possible.

The operation of heating the component at the first temperature for the first duration may include ramping the temperature up at a selected rate, such as about 50° C./hr, 100° C./hr, 150° C./hr, or any other suitable rate.

As noted above, the first temperature may refer to a temperature of the component itself, or a temperature of an environment surrounding the component (e.g., a furnace or kiln). Thus, the operation of heating the component at the first temperature may refer to heating the component itself to the first temperature, or placing the component in an environment having the first temperature. Where the first temperature refers to a temperature of the furnace of kiln, for example, the entire component may or may not reach the same temperature as the furnace or kiln during the heating stage. In some cases, the temperature of the component itself may lag the temperature of the environment, but may ultimately reach the same temperature as the environment. In such cases the component itself may be at the first temperature for less than the first duration.

At operation 904, the component is heated at a second temperature for a second duration. The second temperature may be below the first temperature, and/or may be below a threshold temperature for the material of the component. For example, the second temperature may be below a sintering threshold for the material of the component (e.g., a temperature at which a ceramic material of the component fuses together), or below a temperature at which microstructural changes occur in a ceramic material (e.g., a temperature that will cause coarsening of the crystal structure of a ceramic material). The second temperature may be below about 1400° C., about 1300° C., about 1100° C., or about 1000° C.

While the second temperature may be below the first temperature and/or below a threshold temperature of the material of the component, the second temperature may be above another threshold temperature, such as a stabilization threshold temperature of a pigment incorporated into the component. The pigment stabilization threshold temperature may depend and/or be selected at least in part on the particular type of pigment and ceramic material. For example, for pigments containing manganese oxide and cobalt oxide, the stabilization threshold temperature may be about 900° C., about 800° C., or about 700° C.

The component may be cooled to the second temperature in any suitable manner. For example, the component may be cooled to the second temperature by reducing the temperature in a furnace or kiln to the second temperature and allowing the furnace or kiln and the component to naturally cool to the second temperature. Other techniques may also be used, such as removing the component from one furnace and placing it directly into another furnace at the second temperature, or by actively cooling the component with a fluid (e.g., air). In some cases, the ramp-down rate from the first temperature to the second temperature is about −50° C./hr, about −100° C./hr, about −150° C./hr, or any other suitable rate. The ramp-down rate may be the same absolute value as the ramp-up rate to the first temperature, or it may be different.

The second duration may be any suitable duration, and may be selected or otherwise depend at least in part on the material of the component, a pigment in the component, a desired pigment stabilization threshold, the first and/or second temperatures, and the like. For example, as described above, the second duration may be selected in conjunction with the second temperature to produce a target color gradient, such as a maximum variation in color up to a certain depth within the component being at or below a certain threshold (e.g., a Delta E 76 value of less than or equal to about 2.0, 1.5, 1.2, or 1.0). In some cases, the second duration is between about 1 and about 5 hours, between about 4 and about 7 hours, or any other suitable duration After the component is heated at the second temperature for the second duration, the component may be cooled to an ambient temperature. The component may be cooled in any suitable way and at any suitable ramp-down rate, such as at $-50°$ C./hr, about $-100°$ C./hr, about $-150°$ C./hr, or any other suitable rate. Like the heating temperatures described herein, the ramp-up and ramp-down rates may refer to the rate of change of the temperature of the component, or the rate of change of the temperature of the environment around the component.

After the component is heated at the second temperature for the second duration (and optionally after the component is cooled to an ambient temperature), material is removed from the component at operation 906. Operation 906 may correspond to or be similar to operation 812. In particular, the material may be removed using any suitable process (e.g., machining, cutting, ablation, etc.). Material may be removed to a specified or selected depth, or to produce a component of a selected or specified dimension. While the material removal operation may reach different depths in different components, and even different depths in different locations of a single component, the process 900 may have stabilized and homogenized the color of the pigment such that there is no perceptible difference in color between any two components or between two locations on a given component.

The processes 800 and 900 described with respect to FIGS. 8-9 may be used to produce or manufacture housings having colors and/or color gradients with particular characteristics. For example, a housing may include a wall (e.g., the wall 202, FIG. 2) formed of a ceramic material (e.g., zirconia) and including a pigment. The sintering profile, pigment, and/or other manufacturing, material, or pigment properties, may be selected to produce a particular color gradient through the wall of the housing. For example, in some cases, the gradient may be such that a color distance between a first portion of the ceramic material that is at or near an exterior surface of the housing (before or after any machining operations such as lapping, polishing, grinding, or the like are performed) and a second portion of the ceramic material that is about 0.5 mm below the exterior surface has a Delta E 76 value of less than or equal to about 2.0. In some cases, the Delta E 76 value is less than or equal to about 1.0, or less than or equal to about 0.5. In some cases, the gradient may be such that a color distance between a first portion of the ceramic material that is at or near an exterior surface of the housing (e.g., either a machined surface of a final part of an un-machined surface of a final or an intermediate part) and a second portion of the ceramic material that is about 0.25 mm below the exterior surface has a Delta E 76 value of less than or equal to about 1.0.

In some cases, the color gradient may have or be defined by a certain range of color space coordinate values. For example, the exterior surface of the wall may have a first b* value (in the CIELAB color space), while a portion of the wall about 0.5 mm below the exterior surface has a second b* value that is less than about 0.5 units (or less than about 0.3 units) different from the first b* value. In some cases, a color of the exterior surface of the wall may have an L* value between about 75 and about 95, an a* value between about $-15$ and about 5.0, and a b* value between about $-10$ and about 10, while a color of the portion of the wall about 0.5 mm below the exterior surface may have an L* value between about 75 and about 95, an a* value between about $-15$ and about 5.0, and a b* value between about $-10$ and about 10.

Housings with color gradients such as those described above may have a relatively consistent color. For example, the color gradient may be sufficiently small (e.g., representing a small change or shift in color) that normal variations in sintering, machining, or other manufacturing processes may not result in housings of perceptibly different colors.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. For example, while the methods or processes disclosed herein have been described and shown with reference to particular operations performed in a particular order, these operations may be combined, subdivided, or re-ordered to form equivalent methods or processes without departing from the teachings of the present disclosure. Moreover, structures, features, components, materials, steps, processes, or the like, that are described herein with respect to one embodiment may be omitted from that embodiment or incorporated into other embodiments.

What is claimed is:

1. A housing for an electronic device, comprising:
    a wall defining an exterior surface of the housing and comprising:
        a ceramic material;
        a pigment incorporated with the ceramic material; wherein
    a color distance between a first portion of the ceramic material at or near the exterior surface and a second portion of the ceramic material about 0.5 mm below the exterior surface has a Delta E 76 value of less than or equal to about 2.0; and
    a color of the first portion and a color of the second portion each has an L* value greater than about 87.

2. The housing of claim 1, wherein the Delta E 76 value is less than or equal to about 1.0.

3. The housing of claim 1, wherein the Delta E 76 value is less than or equal to about 0.5.

4. The housing of claim 1, wherein:
    the first portion has a first b* value; and
    the second portion has a second b* value that is less than about 0.5 units different from the first b* value.

5. The housing of claim 1, wherein:
the first portion has a first b* value; and
the second portion has a second b* value that is less than about 0.3 units different from the first b* value.

6. The housing of claim 1, wherein the ceramic material is zirconia.

7. The housing of claim 1, wherein:
a color of the first portion has an a* value between about −15 and about 5.0, and a b* value between about −10 and about 10; and
a color of the second portion has an a* value between about −15 and about 5.0, and a b* value between about −10 and about 10.

8. The housing of claim 1, wherein the color of the first portion has an L* value between about 88 and about 93 and the color of the second portion has an L* value between about 88 and about 93.

9. A method of manufacturing a housing of an electronic device, comprising:
heating, at a first temperature for a first duration, a ceramic housing precursor comprising a ceramic material and a pigment, thereby sintering the ceramic material and forming the housing;
heating the housing at a second temperature for a second duration, the second temperature being lower than the first temperature, lower than a sintering threshold of the ceramic material, and higher than a pigment stabilization threshold;
cooling the housing; and
removing material from the housing up to a selected depth.

10. The method of claim 9, wherein:
the ceramic material comprises zirconia; and
the pigment comprises one or both of manganese oxide and cobalt oxide.

11. The method of claim 9, wherein the second duration is longer than the first duration.

12. The method of claim 9, wherein the operation of heating the housing at the second temperature does not coarsen a microstructure of the housing.

13. The method of claim 9, wherein the pigment stabilization threshold is about 700° C.

14. The method of claim 9, wherein:
the first duration is between about 1.5 hours and about 2.5 hours; and
the second duration is between about 1.5 hours and about 5.5 hours.

15. A housing for an electronic device, comprising:
a pigmented ceramic wall defining a machined exterior surface of the housing and having:
a color, of the machined exterior surface of the housing, having an L* value greater than about 87, an a* value between about −5.0 and about 5.0, and a b* value between about −5.0 and about 5.0; and
a color distance between the machined exterior surface of the housing and a portion of the ceramic material about 0.25 mm below the machined exterior surface has a Delta E 76 value of less than or equal to about 1.0.

16. The housing of claim 15, wherein the color of the machined exterior surface of the housing has an L* value between about 88 and about 93, an a* value between about −2.0 and about 3.0, and a b* value between about −1.5 and about 3.5.

17. The housing of claim 15, wherein the color distance between the machined exterior surface of the housing and the portion of the ceramic material about 0.25 mm below the machined exterior surface has a Delta E 76 value of less than or equal to about 0.5.

18. The housing of claim 15, wherein the pigmented ceramic wall comprises zirconia.

19. The housing of claim 15, wherein the pigmented ceramic wall has been machined to remove at least about 0.25 mm of material.

* * * * *